US007898845B2

(12) United States Patent
Tsuchida (10) Patent No.: US 7,898,845 B2
(45) Date of Patent: Mar. 1, 2011

(54) RESISTANCE CHANGE MEMORY

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 159 days.

(21) Appl. No.: 12/404,115

(22) Filed: Mar. 13, 2009

(65) Prior Publication Data

US 2009/0316471 A1 Dec. 24, 2009

(30) Foreign Application Priority Data

Jun. 23, 2008 (JP) ............................. 2008-163770

(51) Int. Cl.
*G11C 11/00* (2006.01)
(52) U.S. Cl. ..................... 365/158; 365/171; 365/173
(58) Field of Classification Search .................. 365/158, 365/171, 173
See application file for complete search history.

(56) References Cited

U.S. PATENT DOCUMENTS 5,695,864 A 12/1997 Slonczewski 7,505,307 B2 * 3/2009 Ueda .......................... 365/158

OTHER PUBLICATIONS

J. DeBrosse, et al., "A 16Mb MRAM Featuring Bootstrapped Write Drivers," 2004 Symposium on VLSI Circuits Digest of Technical Papers, 2004, pp. 454-457.

* cited by examiner

*Primary Examiner*—Son Dinh
*Assistant Examiner*—Nam Nguyen
(74) *Attorney, Agent, or Firm*—Knobbe, Martens, Olson & Bear LLP (57) ABSTRACT

A resistance change memory includes first and second memory cell arrays which are adjacent to each other in a first direction, first and second reference cell arrays paired with the first and second memory cell arrays, a first sense amplifier shared by the first and second memory cell arrays and arranged between the first and second memory cell arrays, a first data bus which transfers data of a first readout cell in the first memory cell array to the first sense amplifier, and a second data bus which transfers data of a first reference cell in the first reference cell array to the first sense amplifier. The first and second data buses run on both sides of the first sense amplifier in a second direction and cross each other while sandwiching the first sense amplifier.

20 Claims, 9 Drawing Sheets

RESISTANCE CHANGE MEMORY

CROSS-REFERENCE TO RELATED APPLICATIONS

This application is based upon and claims the benefit of priority from prior Japanese Patent Application No. 2008-163770, filed Jun. 23, 2008, the entire contents of which are incorporated herein by reference.

BACKGROUND OF THE INVENTION

1. Field of the Invention

The present invention relates to a resistance change memory in which data buses that connect cell arrays and sense amplifiers cross each other.

2. Description of the Related Art

In the readout system circuit of a conventional magnetic random access memory, a sense amplifier is arranged between two adjacent memory cell groups. The memory cell groups exclusively operate, thereby sharing the sense amplifier. Since the two memory cell groups share the sense amplifier, data buses are arranged on the left and right sides of the sense amplifier. Each data bus functions as a bus dedicated to the left or right array.

When a memory cell is selected in the readout operation of the readout system circuit, a reference cell is simultaneously selected. Memory cell data and reference cell data are transferred to the sense amplifier via the data buses. Let n be the number of bits to be read-accessed at once. In this case, n memory cell data buses and n reference cell data buses are necessary. Hence, 2n data buses are necessary on each side of the sense amplifier. This increases the data bus area in the chip size.

[Non-Patent Reference 1] "16 Mb MRAM Featuring Bootstrap Write Driver", 2004 Symposium on VLSI Circuits, Digest of Technical Paper, pp. 454-457

[Patent Reference 1] U.S. Pat. No. 5,695,864

BRIEF SUMMARY OF THE INVENTION

A resistance change memory according to an aspect of the present invention comprising a first memory cell array and a second memory cell array which are adjacent to each other in a first direction, each of the first memory cell array and the second memory cell array including a plurality of memory cells arranged in a matrix, and each of the memory cells including a resistance change element and a selection transistor; a first reference cell array which is paired with the first memory cell array; a second reference cell array which is paired with the second memory cell array; a first sense amplifier which is shared by the first memory cell array and the second memory cell array and arranged between the first memory cell array and the second memory cell array; a first data bus which transfers data of a first readout cell in the first memory cell array to the first sense amplifier; and a second data bus which transfers data of a first reference cell in the first reference cell array to the first sense amplifier, the first reference cell being paired with the first readout cell, wherein the first data bus and the second data bus run on both sides of the first sense amplifier in a second direction perpendicular to the first direction and cross each other while sandwiching the first sense amplifier.

DETAILED DESCRIPTION OF THE INVENTION

The embodiments of the present invention will now be described using an MRAM (Magnetic Random Access Memory) as an example of a resistance change memory. In the following explanation, the same reference numerals denote the same parts throughout the drawing.

[1] First Embodiment

In the first embodiment, data buses arranged on the left and right sides of sense amplifiers cross each other in the boundary area between memory cell groups and reference cell groups to be accessed.

[1-1] Readout System Circuit

Figure 1:
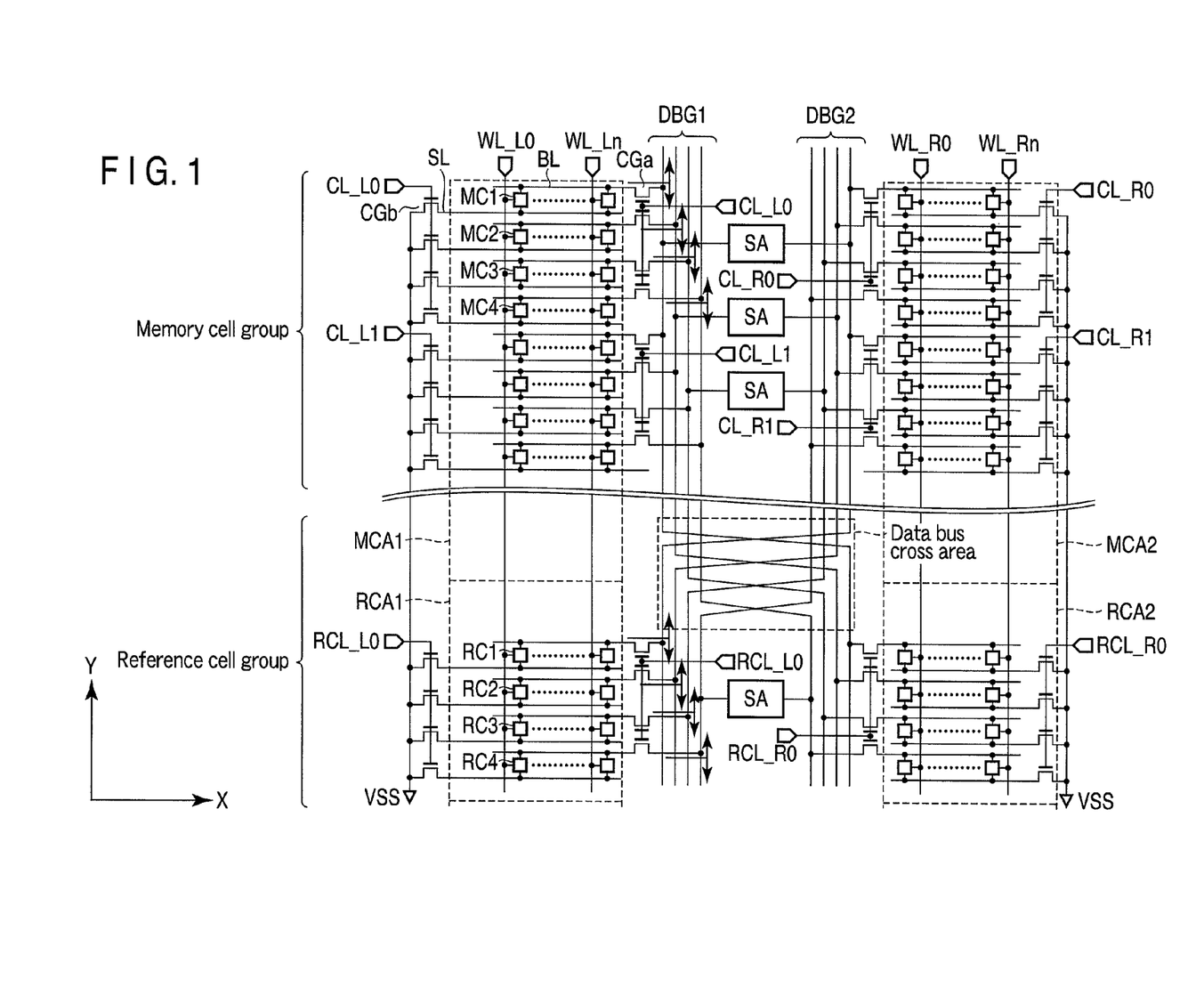
FIG. 1 is a schematic circuit diagram of the readout system circuit of a magnetic random access memory according to the first embodiment of the present invention.

FIG. 1 is a schematic circuit diagram of the readout system circuit of a magnetic random access memory according to the first embodiment of the present invention. The schematic circuit arrangement of the readout system circuit according to the first embodiment will be described below.

As shown in FIG. 1, the magnetic random access memory includes memory cell arrays MCA1 and MCA2, reference cell arrays RCA1 and RCA2, data bus groups DBG1 and DBG2, and sense amplifiers SA.

Each of the memory cell arrays MCA1 and MCA2 includes a plurality of memory cells MCn (n=1, 2, 3, . . . ) arranged in a matrix. The memory cell arrays MCA1 and MCA2 are adjacent to each other in the X direction.

The reference cell arrays RCA1 and RCA2 are arranged adjacent to the memory cell arrays MCA1 and MCA2, respectively, in the Y direction. Each of the reference cell arrays RCA1 and RCA2 includes a plurality of reference cells RCn (n=1, 2, 3, . . . ) arranged in a matrix. The reference cell array RCA1 has the same cell array structure as the memory cell array MCA1 and is paired with it in the readout mode. Similarly, the reference cell array RCA2 has the same cell array structure as the memory cell array MCA2 and is paired with it in the readout mode.

The plurality of sense amplifiers SA are arranged between the memory cell arrays MCA1 and MCA2 and between the reference cell arrays RCA1 and RCA2. The two memory cell arrays MCA1 and MCA2 exclusively operate, thereby sharing the sense amplifiers SA between them. Similarly, the two reference cell arrays RCA1 and RCA2 exclusively operate, thereby sharing the sense amplifiers SA between them.

The data bus groups DBG1 and DBG2 are arranged on the left and right sides of the sense amplifiers SA. Each of the data bus groups DBG1 and DBG2 includes a plurality of data buses. The number of data buses in each of the data bus groups DBG1 and DBG2 corresponds to the number of cells to be read-accessed at once. In this example, each data bus group includes four data buses. The data bus groups DBG1 and DBG2 run in the Y direction on the left and right sides of the sense amplifiers SA and cross each other while sandwiching the sense amplifiers SA between them. The area where the data bus groups DBG1 and DBG2 cross is the area between the memory cell arrays MCA1 and MCA2 and the reference cell arrays RCA1 and RCA2. Note that the above-described cross of the data bus groups DBG1 and DBG2 can be either physical or logical.

A memory cell MC1 is connected to a bit line BL, a word line WL_L0, and a source line SL. The bit line BL is connected to a column gate CGa. The column gate CGa is connected to one data bus of the data bus group DBG1. The plurality of cells MCn and RCn of a single column share the word line WL_L0. The source line SL is connected to a column gate CGb. The column gate CGb is connected to a ground terminal VSS.

[1-2] Readout Operation

A readout operation according to this embodiment will be described with reference to FIG. 1. An example will be explained here in which a word line WL_L0 and a column selection line CL_L0 in the memory cell array MCA1 correspond to the access target addresses.

In this case, memory cells MC1 to MC4 corresponding to four bits are simultaneously selected as the readout targets. Readout cell data are transferred to the four sense amplifiers SA via the four data buses of the data bus group DBG1. At this time, it is necessary to simultaneously activate reference cells RC1 to RC4 to be input to the sense amplifiers SA. Hence, a reference column selection line RCL_L0 is activated simultaneously to select the reference cells RC1 to RC4.

Collision of the readout cell data and the reference cell data on the data buses needs to be prevented. It is therefore necessary to transfer the reference cell data to the sense amplifiers SA via the four data buses dedicated to the reference cells, which are different from the data buses to transfer the readout cell data. To implement this, the area where the data bus groups DBG1 and DBG2 cross around the sense amplifiers SA is provided at the boundary between the areas where the reference cell groups are arranged and the areas where the memory cell groups are arranged. This makes it possible to input the reference cell data to the sense amplifiers SA via the data bus group DBG2 that is different from the data bus group DBG1 to read out the readout cell data, and avoid any collision of the readout cell data and the reference cell data on the data buses.

Even when a word line WL_R0 and a column selection line CL_R0 in the memory cell array MCA2 correspond to the access target addresses, readout data are read out to data buses near the selected array, and reference data are read out to data buses near an unselected array. It is therefore possible to hold the consistency of bit selection viewed from the sense amplifiers SA.

[1-3] Layout Example 1

Figure 2:
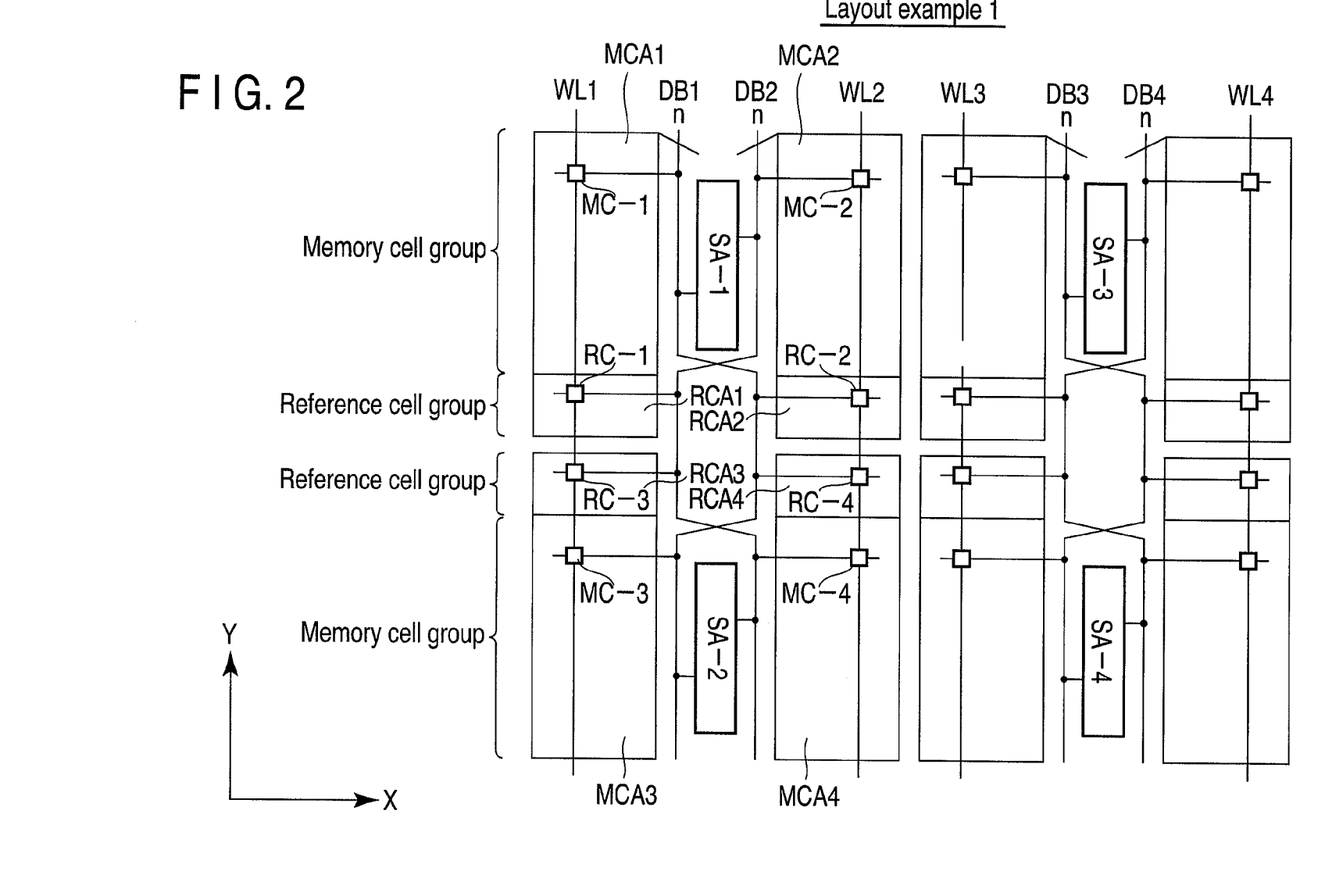
FIG. 2 is a schematic view of Layout Example 1 of the readout system circuit according to the first embodiment of the present invention.

FIG. 2 is a schematic view of Layout Example 1 of the readout system circuit according to the first embodiment of the present invention. A schematic layout example of the readout system circuit and, more particularly, the memory cell arrays, reference cell arrays, data buses, and sense amplifiers according to the first embodiment will be described below.

As shown in FIG. 2, cell groups include memory cell groups and reference cell groups. The memory cell groups include memory cell arrays MCA1, MCA2, MCA3, and MCA4. The reference cell groups include reference cell arrays RCA1, RCA2, RCA3, and RCA4.

The memory cell arrays MCA1, MCA2, MCA3, and MCA4 have memory cells MC-1, MC-2, MC-3, and MC-4, respectively. The memory cell arrays MCA1 and MCA2 are adjacent to each other in the X direction. The memory cell arrays MCA3 and MCA4 are adjacent to each other in the X direction. The memory cell arrays MCA1 and MCA3 are adjacent to each other in the Y direction. The memory cell arrays MCA2 and MCA4 are adjacent to each other in the Y direction.

The reference cell arrays RCA1, RCA2, RCA3, and RCA4 have reference cells RC-1, RC-2, RC-3, and RC-4, respectively. The reference cell array RCA1 is paired with the memory cell array MCA1 and arranged adjacent to its one end on the side of the memory cell array MCA3. The reference cell array RCA2 is paired with the memory cell array MCA2 and arranged adjacent to its one end on the side of the memory cell array MCA4. The reference cell array RCA3 is paired with the memory cell array MCA3 and arranged adjacent to its one end on the side of the memory cell array MCA1. The reference cell array RCA4 is paired with the memory cell array MCA4 and arranged adjacent to its one end on the side of the memory cell array MCA2.

A sense amplifier SA-1 is arranged between the memory cell arrays MCA1 and MCA2. The sense amplifier SA-1 is shared by the memory cell arrays MCA1 and MCA2 and also by the reference cell arrays RCA1 and RCA2. A sense amplifier SA-2 is arranged between the memory cell arrays MCA3 and MCA4. The sense amplifier SA-2 is shared by the memory cell arrays MCA3 and MCA4 and also by the reference cell arrays RCA3 and RCA4.

A data bus DB1 transfers, e.g., data from the memory cell MC-1 and the reference cell RC-2 to the sense amplifier SA-1, or data from the memory cell MC-3 and the reference cell RC-4 to the sense amplifier SA-2. A data bus DB2 transfers, e.g., data from the memory cell MC-2 and the reference cell RC-1 to the sense amplifier SA-1, or data from the memory cell MC-4 and the reference cell RC-3 to the sense amplifier SA-2.

The data bus DB1 runs between the memory cell array MCA1 and the sense amplifier SA-1, then near the reference cell arrays RCA2 and RCA4, and finally between the memory cell array MCA3 and the sense amplifier SA-2. The data bus DB2 runs between the memory cell array MCA2 and the sense amplifier SA-1, then near the reference cell arrays RCA1 and RCA3, and finally between the memory cell array MCA4 and the sense amplifier SA-2.

That is, the data buses DB1 and DB2 run on both sides of the sense amplifier SA-1, cross once at an end of the sense amplifier SA-1, cross again at an end of the sense amplifier SA-2, and then run on both sides of the sense amplifier SA-2. The data buses DB1 and DB2 therefore cross twice between the sense amplifiers SA-1 and SA-2. In FIG. 2, the first cross area of the data buses DB1 and DB2 includes the boundary area between the memory cell array MCA1 and the reference cell array RCA1 and that between the memory cell array MCA2 and the reference cell array RCA2. The second cross area of the data buses DB1 and DB2 includes the boundary area between the memory cell array MCA3 and the reference cell array RCA3 and that between the memory cell array MCA4 and the reference cell array RCA4.

In Layout Example 1 described above, when the memory cell MC-1 is selected, the reference cell RC-1 is selected simultaneously. The memory cell data and the reference cell data are transferred to the sense amplifier SA-1 via the data buses DB1 and DB2. Let n be the number of bits to be read-accessed at once, as described above. In this case, since n data buses DB1 or DB2 are provided on each side of the sense amplifier SA-1, the readout operation can consistently be performed. When the memory cell MC-2, MC-3, or MC-4 is selected, the reference cell RC-2, RC-3, or RC-4 is selected simultaneously, and the data are read out to the sense amplifiers SA-1 and SA-2. In all cases, n data buses suffice on each side of the sense amplifiers SA-1 and SA-2.

[1-4] Memory Cell

Figure 3:
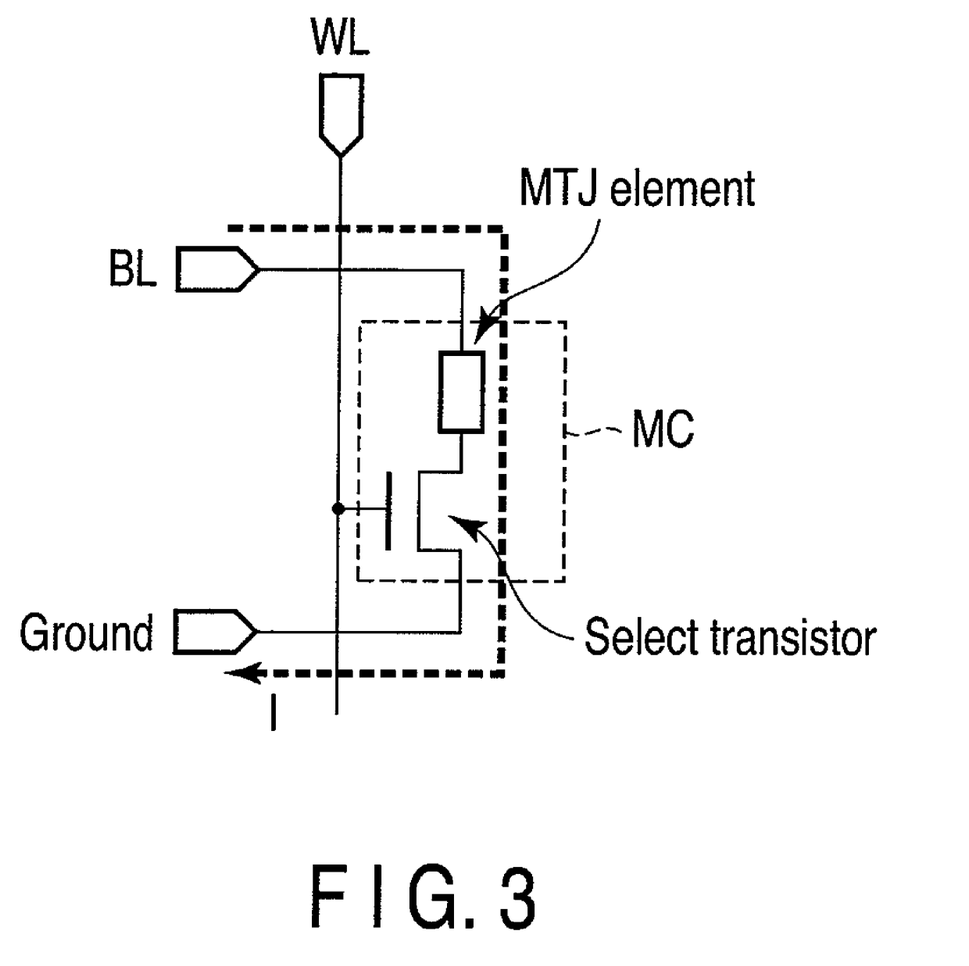
FIG. 3 is a circuit diagram showing the structure of a memory cell according to the first embodiment of the present invention.

The structure of a memory cell according to this embodiment will be described with reference to FIG. 3.

In this embodiment, a magnetic random access memory is used as an example of a resistance change memory. Hence, a memory cell MC includes an MTJ (Magnetic Tunnel Junction) element having a TMR (Tunneling Magneto Resistive) effect, and a selection transistor. The MTJ element and the selection transistor are connected in series. One terminal of the MTJ element is connected to the bit line BL. The other terminal of the MTJ element is connected to one end of the current path of the selection transistor. The other end of the current path of the selection transistor is connected to the ground terminal. The gate of the selection transistor is connected to the word line WL.

A plurality of memory cells MC are arranged in a matrix to form a memory cell array. A control circuit group including a decoder circuit and a sense circuit is provided around the memory cell array, thereby implementing the readout operation and write operation by random access to arbitrary bits.

The MTJ element has a multilayered structure including an insulating film sandwiched between two metal films which are ferromagnetic layers, and exhibits a magnetic resistance change caused by a spin polarization tunnel effect.

More specifically, the MTJ element takes the following resistance values. If the spin directions of the upper and lower ferromagnetic layers are parallel, the tunnel probability between the two magnetic layers via the tunnel insulating film is maximum, and the resistance value is minimum. On the other hand, if the spin directions of the upper and lower ferromagnetic layers are antiparallel, the tunnel probability is minimum, and the resistance value is maximum. To attain the two spin states, normally, the direction of magnetization of one of the two magnetic layers is fixed not to be affected by external magnetization. This layer is generally called a pinned layer (fixed layer). The direction of magnetization of the other magnetic layer can be programmed to parallel or antiparallel with respect to the pinned layer by the direction of applied magnetization. This layer is generally called a free layer (recording layer) to store information. In some current MTJ elements, the resistance change ratio (MR ratio) exceeds 50%.

Readout from the magnetic random access memory using MTJ elements is performed in the following way. The bit line connected to one terminal of a selected MTJ element is connected to a sense amplifier, and the other terminal is of the MTJ element is fixed at the ground potential so that a current I flows to the memory cell MC. The sense amplifier detects and amplifies a change in the resistance of the MTJ element. A voltage is applied between the two magnetic layers of the MTJ element corresponding to the selected bit line BL, and the resistance value is read from the current I flowing through the MTJ element. Alternatively, the constant current I is supplied to the selected MTJ element, and the voltage across the two magnetic layers is read out.

Write in the magnetic random access memory using MTJ elements is performed in the following way. In a synthetic magnetic field writing method, the predetermined current I or more is supplied to the bit line BL and the word line WL to invert the direction of magnetization of the free layer of an MTJ element. The direction of magnetization of the free layer is rewritten by the magnitude of the synthetic magnetic field generated by the current I (e.g., non-patent reference 1). In a spin transfer torque writing method, the write is performed by directly inverting the magnetization by the function of spin-polarized electrons (e.g., patent reference 1). The direction of magnetization of the free layer is controlled by the direction of flowing electrons, i.e., the direction of the current I. In the spin transfer torque writing method, the write is enabled by flowing, to an element, a current having a density equal to or more than a given threshold. It is therefore possible to reduce the current I necessary for the write in proportion to the square of the element size reduction ratio when microfabricating the element. This conforms to the scaling rules and ensures more excellent characteristics for element microfabrication as compared to the synthetic magnetic field writing method.

[1-5] Effects

According to the first embodiment, the sense amplifier group SA shared by the two adjacent memory cell arrays MCA1 and MCA2 is arranged between them. The data bus groups DBG1 and DBG2 for the readout are arranged on both sides of the sense amplifier group SA. In this structure, the data bus group DBG1 to which readout target cells are connected and the data bus group DBG2 to which reference cell data are read out cross near the sense amplifiers SA. The cross area is laid out at the boundary between the areas where the readout target cell groups are arranged and the areas where the reference cell groups are arranged. Let n be the number of bits to be read-accessed at once in one access cycle. In this case, a data bus group DBG including n data buses can be provided on each side of the sense amplifiers SA. This allows utilization of the conventionally unused data bus group DBG on the opposite side of the selected cell array with respect to the sense amplifiers SA. Since the number of data buses DB can be ½ as compared to the prior art, the data bus area in the chip size can be reduced. This enables reduction of the chip size.

For example, when the word line WL_L0 and the column selection line CL_L0 in the memory cell array MCA1 shown in FIG. 1 correspond to the access target addresses, the memory cells MC1 to MC4 corresponding to four bits are simultaneously selected. Readout data are transferred to the sense amplifiers SA via the four data buses of the data bus group DBG1 dedicated to the left array. At this time, it is necessary to simultaneously activate reference cells to be input to the sense amplifiers SA. Hence, the reference column selection line RCL_L0 is activated simultaneously to select the reference cells RC1 to RC4. To prevent collision of the reference cell data and the readout data on the data buses, the reference cell data are transferred to the sense amplifiers SA via the four data buses of the data bus group DBG2 dedicated to the reference cells, which is different from the data bus group DBG1. This allows to hold the consistency of bit selection viewed from the sense amplifiers SA. In this readout method, column gates in equal number, including the reference cells, are connected to all data buses DB. For this reason, all data buses DB have the same parasitic capacitance and the same parasitic resistance. This allows the CR time constant to completely balance viewed from the sense amplifiers SA regardless of the selected cell, and prevents any degradation in the readout margin.

As described above, according to this embodiment, the parasitic capacitance and parasitic resistance between each pair of data buses completely balance when viewed from the sense amplifiers SA. In this state, the data buses DB cross each other. This halves the necessary number of data buses DB and reduces the chip size. It is therefore possible to implement a resistance change memory having a larger capacity at a low cost while maintaining the readout stability.

In this embodiment, each reference cell group is arranged at an end of a memory cell group. However, the reference cell group can be arranged at any place of the memory cell group, including the central portion of the memory cell group.

[2] Second Embodiment

In the first embodiment, the cell arrays on the left and right sides (X direction) of the sense amplifiers exclusively operate. In the second embodiment, cell arrays on the upper and lower sides also exclusively operate. Hence, in the second embodiment, the upper and lower cell arrays share data buses. In the second embodiment, a description of the same arrangement as in the first embodiment will be omitted.

[2-1] Layout Example 2-1

In Layout Example 2-1 of the second embodiment, reference cells are formed in the same array as that of selected cells.

Figure 4:
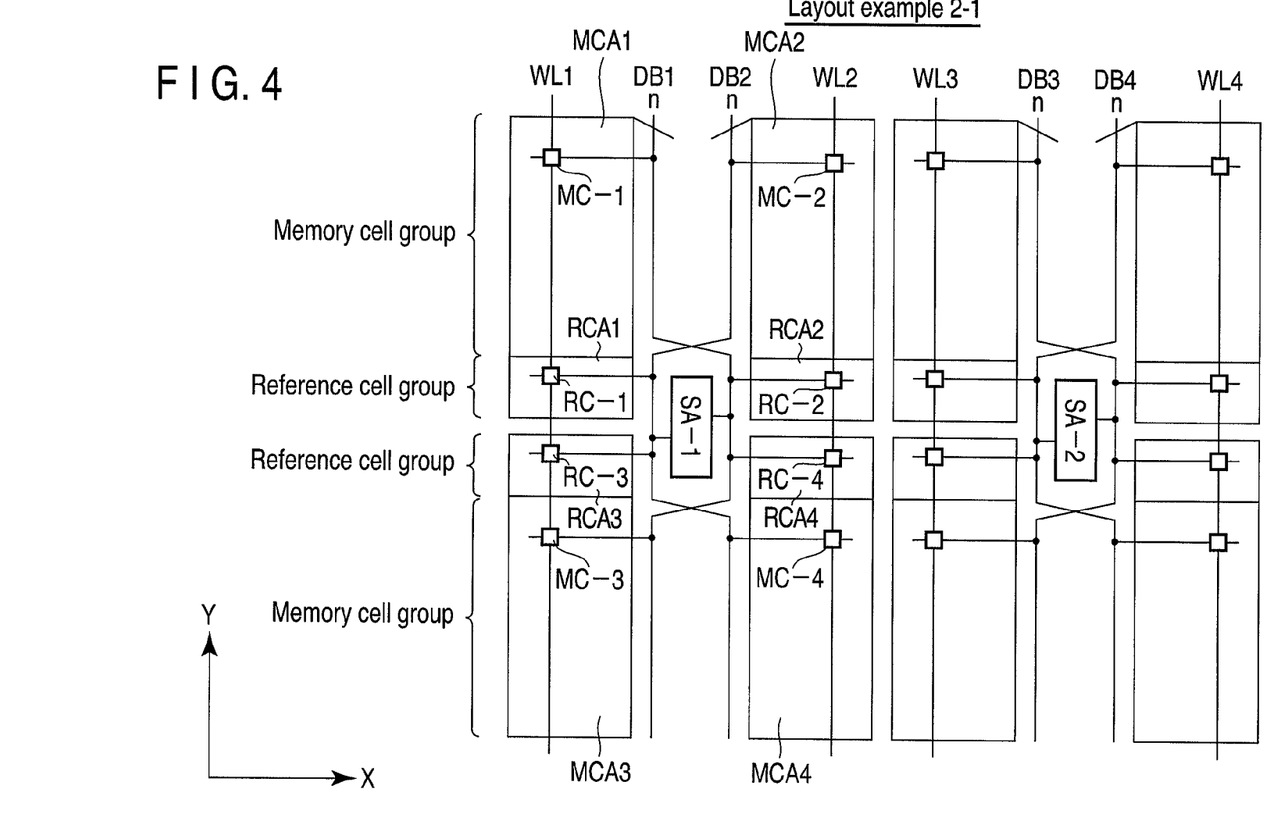
FIG. 4 is a schematic view of Layout Example 2-1 of a readout system circuit according to the second embodiment of the present invention.

FIG. 4 is a schematic view of Layout Example 2-1 of a readout system circuit according to the second embodiment of the present invention. A schematic layout example of the readout system circuit and, more particularly, the memory cell arrays, reference cell arrays, data buses, and sense amplifiers according to the second embodiment will be described below.

As shown in FIG. 4, Layout Example 2-1 is different from the first embodiment in that four memory cell arrays MCA1, MCA2, MCA3, and MCA4 adjacent to each other exclusively operate.

More specifically, the memory cell arrays MCA1, MCA2, MCA3, and MCA4 share a sense amplifier SA-1 and data buses DB1 and DB2. The sense amplifier SA-1 is arranged adjacent to reference cell arrays RCA1, RCA2, RCA3, and RCA4. The data buses DB1 and DB2 cross at two ends of the sense amplifier SA-1. Hence, the sense amplifier SA-1 is arranged between the two cross areas of the data buses DB1 and DB2.

In this layout, when a memory cell MC-1 is selected, a reference cell RC-1 in the same cell array RCA1 as that of the memory cell MC-1 is selected simultaneously. The memory cell data and the reference cell data are transferred to the sense amplifier SA-1 via the data buses DB1 and DB2. Let n be the number of bits to be read-accessed at once, as described above. In this case, since n data buses DB1 or DB2 are provided on each side of the sense amplifier SA-1, the readout operation can consistently be performed.

[2-2] Layout Example 2-2

In Layout Example 2-2 of the second embodiment, reference cells are formed in an array different from that of selected cells.

Figure 5:
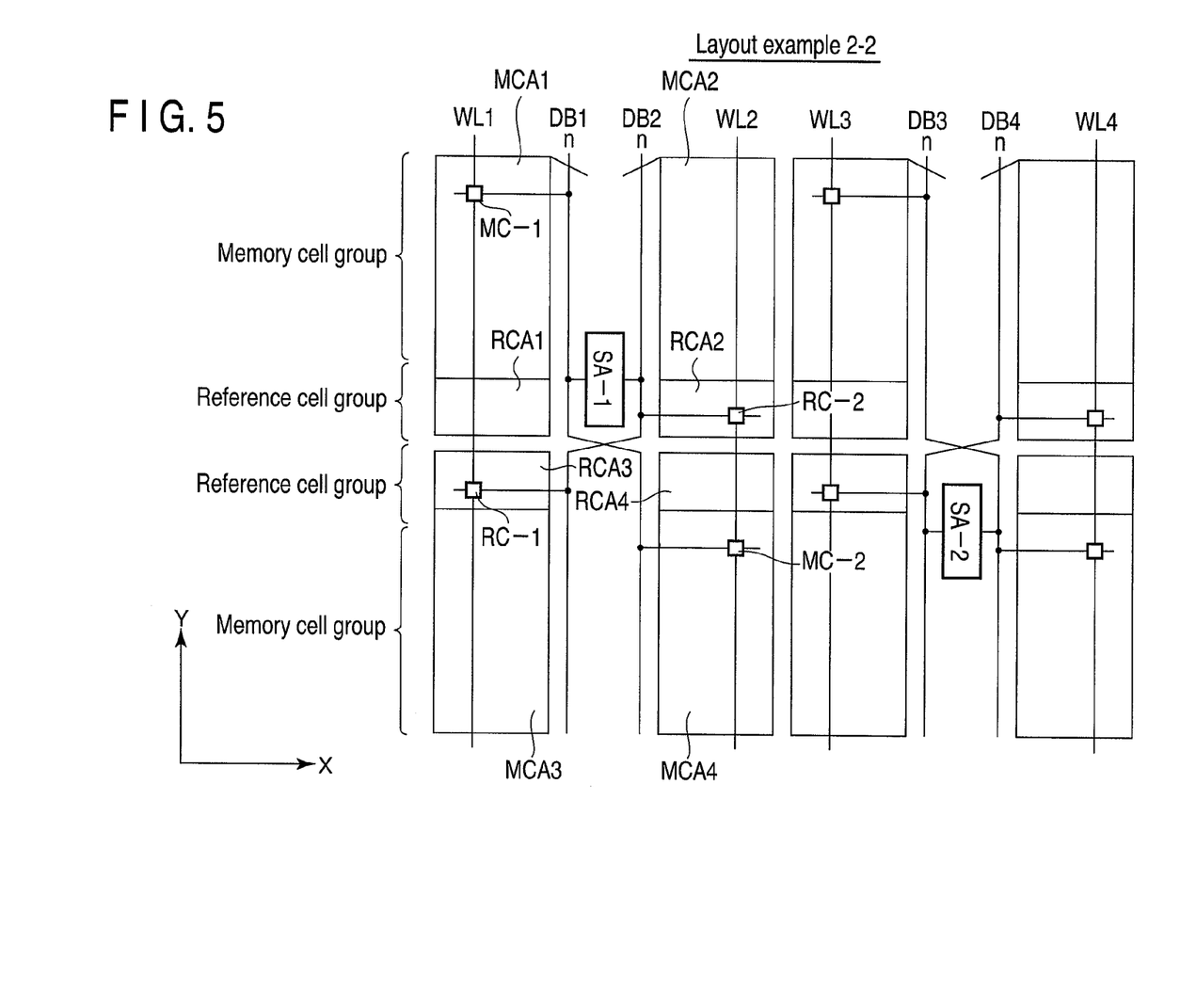
FIG. 5 is a schematic view of Layout Example 2-2 of the readout system circuit according to the second embodiment of the present invention.

FIG. 5 is a schematic view of Layout Example 2-2 of the readout system circuit according to the second embodiment of the present invention. A schematic layout example of the readout system circuit and, more particularly, the memory cell arrays, reference cell arrays, data buses, and sense amplifiers according to the second embodiment will be described below.

As shown in FIG. 5, Layout Example 2-2 is different from the first embodiment in that the four memory cell arrays MCA1, MCA2, MCA3, and MCA4 adjacent to each other exclusively operate, and the number of cross areas of the data buses DB1 and DB2 decreases from two to one. To implement this arrangement, a reference cell is selected from an array on the upper or lower side, which is on a side opposite to the array of a selected cell, and the reference cell data is input to the sense amplifier SA-1.

For example, when the memory cell MC-1 arranged in the memory cell array MCA1 on the upper left side of the sense amplifier SA-1 is selected, the reference cell RC-1 arranged in the reference cell array RCA3 on the lower left side of the sense amplifier SA-1 is selected simultaneously. On the other hand, when a memory cell MC-2 arranged in the memory cell array MCA4 on the lower right side of the sense amplifier SA-1 is selected, a reference cell RC-2 arranged in the reference cell array RCA2 on the upper right side of the sense amplifier SA-1 is selected simultaneously.

[2-3] Effects

According to Layout Examples 2-1 and 2-2 of the second embodiment, the same effects as in the first embodiment can be obtained. Additionally, the number of sense amplifiers can be reduced by increasing the number of cell arrays that exclusively operate. This allows to reduce the chip size as the number of sense amplifiers decreases.

According to Layout Example 2-2, a reference cell is selected from an array on the upper or lower side, which is on a side opposite to the array of a selected cell, and the reference cell data is input to the sense amplifier SA-1. This decreases the number of cross areas of the data buses DB1 and DB2 to one at the boundary portion between the upper and lower arrays. It is therefore possible to reduce the cross area of the data buses DB1 and DB2 and further reduce the size of the chip size.

In this embodiment, each reference cell group is arranged at an end of a memory cell group. However, the reference cell group can be arranged at any place of the memory cell group, including the central portion of the memory cell group.

[3] Third Embodiment

In the third embodiment, the data of a plurality of selected cells in a single cell array are read out not in one direction but in two directions of the array.

[3-1] Layout Example 3-1

Layout Example 3-1 of the third embodiment corresponds to Layout Example 2-1 described above. The number of data bus cross areas is two. In Layout Example 3-1, a description of the same arrangement as in Layout Example 2-1 will be omitted.

Figure 6:
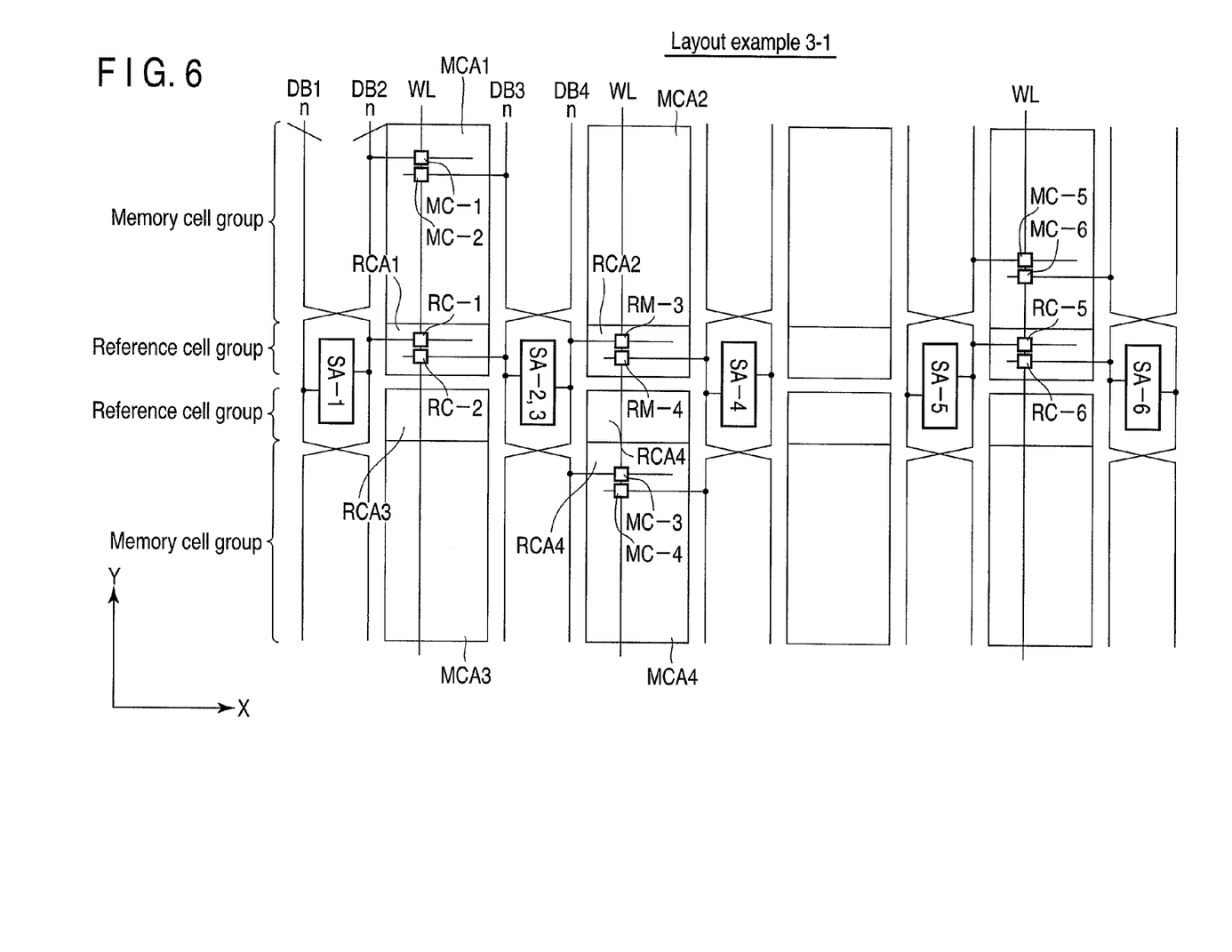
FIG. 6 is a schematic view of Layout Example 3-1 of a readout system circuit according to the third embodiment of the present invention.

FIG. 6 is a schematic view of Layout Example 3-1 of a readout system circuit according to the third embodiment of the present invention. A schematic layout example of the readout system circuit and, more particularly, the memory cell arrays, reference cell arrays, data buses, and sense amplifiers according to the third embodiment will be described below.

As shown in FIG. 6, when memory cells MC-1 and MC-2 in a memory cell array MCA1 are selected, the data of the memory cell MC-1 is read out to a data bus DB2 on the left side of the memory cell array MCA1, and the data of the memory cell MC-2 is read out to a data bus DB3 on the right side of the memory cell array MCA1. That is, the data of the memory cells MC-1 and MC-2 in the same memory cell array MCA1 are read out in two directions of the memory cell array MCA1.

When the memory cell MC-1 in the memory cell array MCA1 is selected, a reference cell RC-1 in a reference cell array RCA1 is selected simultaneously. The data of the memory cell MC-1 is read out to a sense amplifier SA-1 via the data bus DB2, and the data of the reference cell RC-1 is read out to the sense amplifier SA-1 via a data bus DB1.

On the other hand, when the memory cell MC-2 in the memory cell array MCA1 is selected, a reference cell RC-2 in the reference cell array RCA1 is selected simultaneously. The data of the memory cell MC-2 is read out to sense amplifiers SA-2 and SA-3 via the data bus DB3, and the data of the reference cell RC-2 is read out to the sense amplifiers SA-2 and SA-3 via a data bus DB4.

[3-2] Layout Example 3-2

Layout Example 3-2 of the third embodiment corresponds to Layout Example 2-2 described above. The number of data bus cross areas is one. In Layout Example 3-2, a description of the same arrangement as in Layout Example 2-2 will be omitted.

Figure 7:
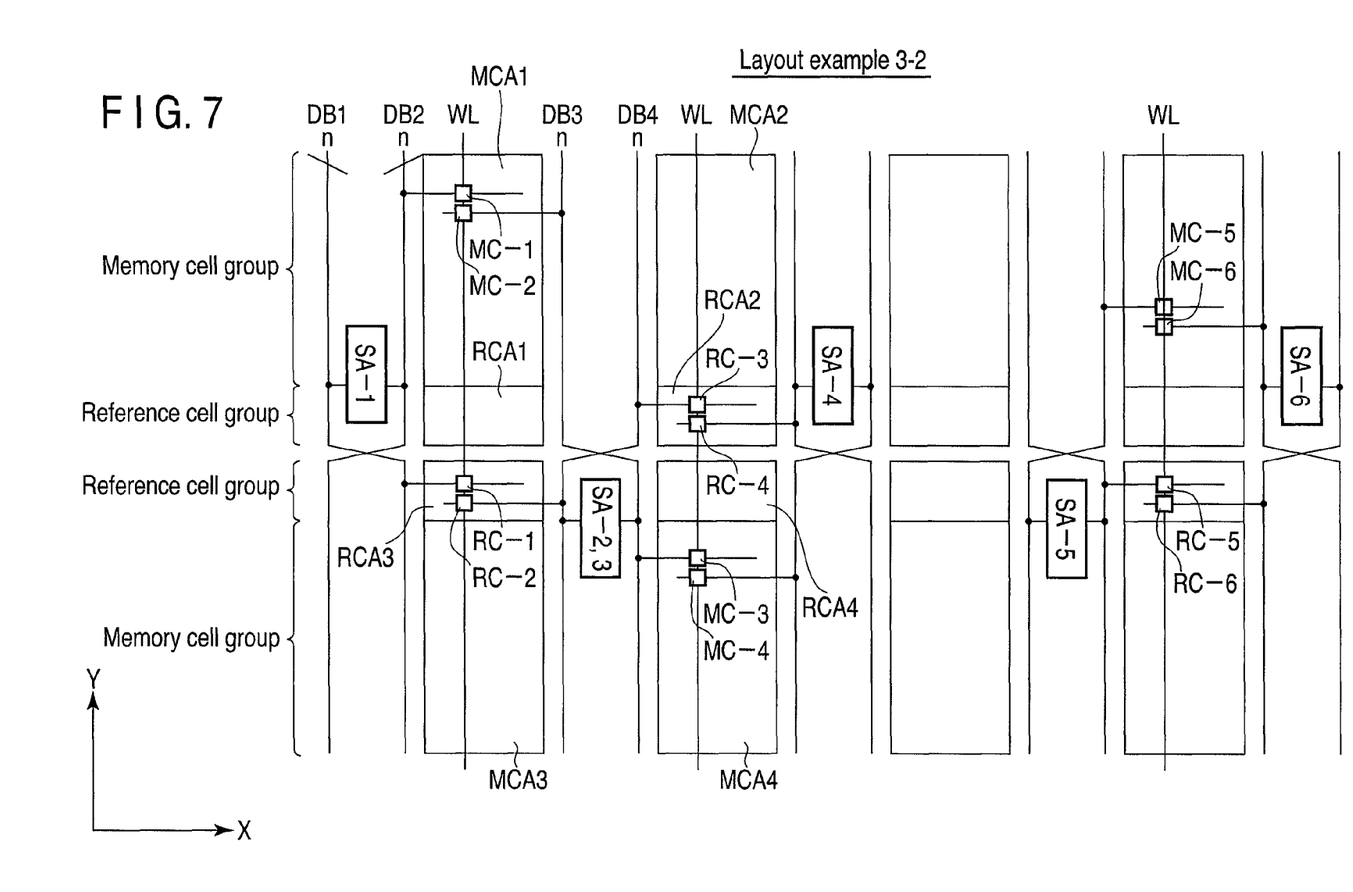
FIG. 7 is a schematic view of Layout Example 3-2 of the readout system circuit according to the third embodiment of the present invention.

FIG. 7 is a schematic view of Layout Example 3-2 of the readout system circuit according to the third embodiment of the present invention. A schematic layout example of the readout system circuit and, more particularly, the memory cell arrays, reference cell arrays, data buses, and sense amplifiers according to the third embodiment will be described below.

As shown in FIG. 7, in Layout Example 3-2, the data of the memory cells MC-1 and MC-2 in the memory cell array MCA1 are read out to the data buses DB2 and DB3 in two directions of the memory cell array MCA1, like Layout Example 3-1 described above.

Layout Example 3-2 is different from Layout Example 3-1 described above in that a reference cell is selected from an array on the upper or lower side, which is on a side opposite to the array of a selected cell, and the reference cell data is input to the sense amplifier SA-1.

More specifically, when the memory cells MC-1 and MC-2 arranged in the memory cell array MCA1 on the upper side are selected, the reference cells RC-1 and RC-2 arranged in a reference cell array RCA3 on the lower side are selected simultaneously. On the other hand, when memory cells MC-3 and MC-4 arranged in a memory cell array MCA4 on the lower side are selected, reference cells RC-3 and RC-4 arranged in a reference cell array RCA2 on the upper side are selected simultaneously.

[3-3] Effects

According to Layout Examples 3-1 and 3-2 of the third embodiment, the same effects as in the first and second embodiments can be obtained. Additionally, the data of a plurality of selected cells in a single cell array are read out in two directions, i.e., to the left and right sides. In this case, the reference cell readout direction is also set in two directions, i.e., to the left and right sides. This enables a consistent readout operation.

In this embodiment, each reference cell group is arranged at an end of a memory cell group. However, the reference cell group can be arranged at any place of the memory cell group, including the central portion of the memory cell group.

[4] Fourth Embodiment

In the first to third embodiments, a selected cell and a reference cell are connected to a single word line. In the fourth embodiment, however, a selected cell and a reference cell are connected to different word lines.

[4-1] Layout Example 4-1

In Layout Example 4-1 of the fourth embodiment, the data of a plurality of selected cells in a single cell array are read out in one direction of the array.

Figure 8:
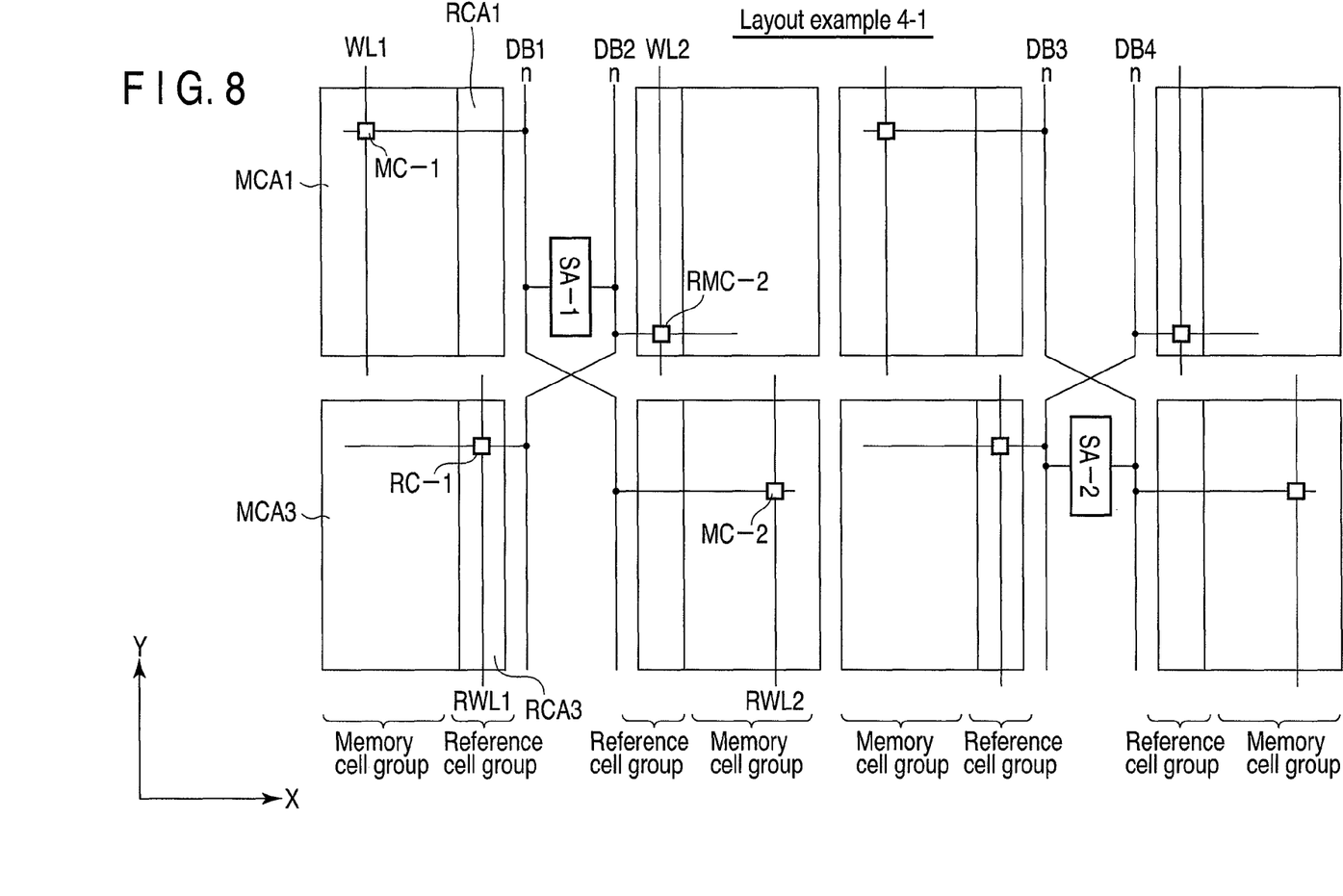
FIG. 8 is a schematic view of Layout Example 4-1 of a readout system circuit according to the fourth embodiment of the present invention.

FIG. 8 is a schematic view of Layout Example 4-1 of a readout system circuit according to the fourth embodiment of the present invention. A schematic layout example of the readout system circuit and, more particularly, the memory cell arrays, reference cell arrays, data buses, and sense amplifiers according to the fourth embodiment will be described below.

As shown in FIG. 8, a reference cell group is arranged on the data bus side (sense amplifier side) at an end of a memory cell group. A selected cell and a reference cell are connected to different word lines.

More specifically, when a word line WL1 is activated, and a memory cell MC-1 in a memory cell array MCA1 is selected, a reference word line RWL1 dedicated to reference cells is activated, and a reference cell RC-1 in a reference cell array RCA3 is selected. In this case as well, data buses DB1 and DB2 cross near the boundary between the memory cell array MCA1 on the upper side and a memory cell array MCA3 on the lower side, thereby decreasing the number of data buses.

[4-2] Layout Example 4-2

In Layout Example 4-2 of the fourth embodiment, the data of a plurality of selected cells in a single cell array are read out not in one direction but in two directions of the array. In Layout Example 4-2, a description of the same arrangement as in Layout Example 4-1 will be omitted.

Figure 9:
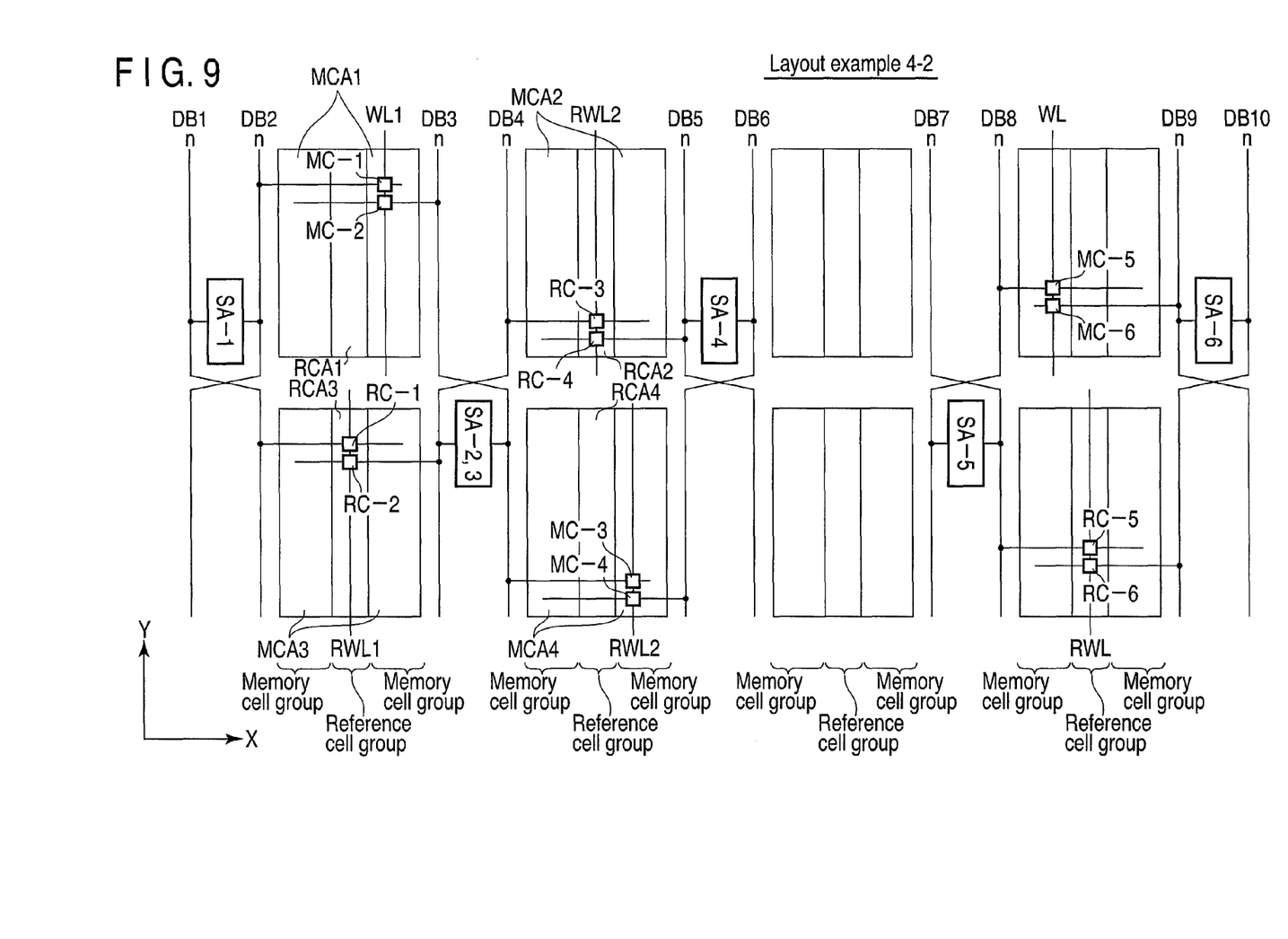
FIG. 9 is a schematic view of Layout Example 4-2 of the readout system circuit according to the fourth embodiment of the present invention.

FIG. 9 is a schematic view of Layout Example 4-2 of a readout system circuit according to the fourth embodiment of the present invention. A schematic layout example of the readout system circuit and, more particularly, the memory cell arrays, reference cell arrays, data buses, and sense amplifiers according to the fourth embodiment will be described below.

As shown in FIG. 9, in Layout Example 4-2, a reference cell group is arranged at the central portion of a memory cell group. A selected cell and a reference cell are connected to different word lines.

When the memory cell MC-1 and a memory cell MC-2 in the memory cell array MCA1 are selected, the data of the memory cell MC-1 is read out to the data bus DB2 on the left side of the memory cell array MCA1, and the data of the memory cell MC-2 is read out to a data bus DB3 on the right side of the memory cell array MCA1. That is, the data of the memory cells MC-1 and MC-2 in the same memory cell array MCA1 are read out in two directions of the memory cell array MCA1.

When the word line WL1 is activated, and the memory cells MC-1 and MC-2 in the memory cell array MCA1 are selected, the reference word line RWL1 dedicated to reference cells is activated, and the reference cell RC-1 and a reference cell RC-2 in the reference cell array RCA3 are selected. In this case as well, selected cells and reference cells in two different cell arrays on the upper and lower sides are activated and input to the sense amplifier, thereby decreasing the number of data buses.

[4-3] Effects

According to the fourth embodiment, Layout Example 4-1 can obtain the same effects as in the first and second embodiments. Layout Example 4-2 can obtain the same effects as in the first and third embodiments.

In this embodiment, each reference cell group is arranged at the central portion of a memory cell group. However, a reference word line RWL can be arranged at any place of the memory cell group, including an end of the memory cell group.

The present invention is not limited to the above-described embodiments, and various changes and modifications can be made in the execution stage without departing from the spirit and scope of the invention. For example, in the above embodiments, a magnetic random access memory has been described as an example of a resistance change memory. However, the present invention is not limited to this, and is also applicable to a PRAM (Phase-change Random Access Memory) using chalcogenide glass, or an ReRAM (Resistance Random Access Memory) using a strongly correlated electron system material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory comprising:
   a first memory cell array and a second memory cell array aligned in a first direction, each of the first memory cell array and the second memory cell array comprising a matrix of a plurality of memory cells, and each of the memory cells comprising a resistance change material and a selection transistor;
   a first reference cell array corresponding with the first memory cell array;
   a second reference cell array corresponding with the second memory cell array;
   a first sense amplifier between the first memory cell array and the second memory cell array, connected to the first memory cell array and the second memory cell array;
   a first data bus configured to transfer data of a first readout cell in the first memory cell array to the first sense amplifier; and
   a second data bus configured to transfer data of a first reference cell in the first reference cell array to the first sense amplifier, the first reference cell corresponding with the first readout cell,
   wherein the first data bus and the second data bus on both sides of the first sense amplifier are configured to extend in a second direction perpendicular to the first direction and to cross each other.

2. The memory of claim 1, wherein an area where the first data bus and the second data bus cross comprises a first boundary area between the first memory cell array and the first reference cell array and a second boundary area between the second memory cell array and the second reference cell array.

3. The memory of claim 1, wherein the second data bus is connected to a second readout cell in order to read out data of the second readout cell in the second memory cell array, and the first data bus is connected to a second reference cell in the second reference cell array and corresponding with the second readout cell.

4. The memory of claim 3, wherein
   either the first readout cell or the second reference cell is selectively connected to the first data bus, and
   either the second readout cell or the first reference cell is selectively connected to the second data bus.

5. The memory of claim 1, wherein
   the first memory cell array and the first reference cell array aligned in the second direction, and comprising first cell arrays, and
   the second memory cell array and the second reference cell array aligned in the second direction, and comprising second cell arrays.

6. The memory of claim 1, further comprising a third memory cell array adjacent to the first memory cell array in the second direction, and comprising a third cell array different from the first memory cell array,
   wherein the first reference cell array is the third memory cell array different from the first memory cell array.

7. The memory of claim 6, wherein the first reference cell is selected from a cell array different from a cell array of the first readout cell when the first readout cell is selected.

8. The memory of claim 1,
   further comprising:
   a second sense amplifier on a side opposite to the first sense amplifier with respect to the first memory cell array;
   a third data bus configured to transfer data of a second readout cell in the first memory cell array to the second sense amplifier; and
   a fourth data bus configured to transfer data of a second reference cell in the first reference cell array to the second sense amplifier, the second reference cell corresponding with the second readout cell, and
   wherein the third data bus and the fourth data bus on opposite sides of the second sense amplifier are configured to extend in the second direction and to cross each other, and the data of the first readout cell and the data of the second readout cell are read out to the first sense amplifier and the second sense amplifier while reading the first readout cell and the second readout cell.

9. The memory of claim 8, wherein
the first memory cell array and the first reference cell array are aligned in the second direction and comprising first cell arrays, and
the second memory cell array and the second reference cell array are aligned in the second direction and comprising second cell arrays.

10. The memory of claim 8, further comprising a third memory cell array adjacent to the first memory cell array in the second direction, and
wherein the first reference cell array is the third memory cell array different from the first memory cell array.

11. The memory of claim 1, wherein the first readout cell and the first reference cell are connected to an identical word line.

12. The memory of claim 1, wherein the first readout cell and the first reference cell are connected to different word lines.

13. The memory of claim 12, further comprising:
a second sense amplifier on a side opposite to the first sense amplifier with respect to the first memory cell array;
a third data bus configured to transfer data of a second readout cell in the first memory cell array to the second sense amplifier; and
a fourth data bus configured to transfer data of a second reference cell in the first reference cell array to the second sense amplifier, the second reference cell corresponding with the second readout cell, and
wherein the third data bus and the fourth data bus on opposite sides of the second sense amplifier are configured to extend in the second direction and to cross each other, and
the data of the first readout cell and the data of the second readout cell are read out to the first sense amplifier and the second sense amplifier while reading the first readout cell and the second readout cell.

14. The memory of claim 1, wherein
the first reference cell array is located between the first memory cell array and the first data bus, and
the second reference cell array is located between the second memory cell array and the second data bus.

15. The memory of claim 1, further comprising a third memory cell array adjacent to the first memory cell array in the second direction and adjacent to the first reference cell array in the first direction, and
wherein the first reference cell array is the third memory cell array different from the first memory cell array.

16. The memory of claim 1, wherein
the first reference cell array is located at an end of the first memory cell array in the second direction, and
the second reference cell array is located at an end of the second memory cell array in the second direction.

17. The memory of claim 1, wherein
the first reference cell array is located on a side of the first data bus at an end of the first memory cell array, and
the second reference cell array is located on a side of the second data bus at an end of the second memory cell array.

18. The memory of claim 1, wherein
the first reference cell array is located at a central portion of the first memory cell array, and
the second reference cell array is located at a central portion of the second memory cell array.

19. The memory of claim 1, wherein a number of first data buses and a number of second data buses are equal to a number of bits to be read-accessed simultaneously in one access cycle.

20. The memory of claim 1, wherein the resistance change element is a Magnetic Tunnel Junction (MTJ) element.

* * * * *